US006509850B1

(12) United States Patent
Bland

(10) Patent No.: US 6,509,850 B1
(45) Date of Patent: Jan. 21, 2003

(54) METHOD AND SYSTEM FOR SAMPLING RATE CONVERSION IN DIGITAL AUDIO APPLICATIONS

(75) Inventor: Dennis Bland, Calgary (CA)

(73) Assignee: Wind River Systems, Inc., Alameda, CA (US)

( * ) Notice: Subject to any disclaimer, the term of this patent is extended or adjusted under 35 U.S.C. 154(b) by 0 days.

(21) Appl. No.: 10/109,479

(22) Filed: Mar. 28, 2002

Related U.S. Application Data

(63) Continuation of application No. 09/919,541, filed on Jul. 31, 2001, now Pat. No. 6,396,421.

(51) Int. Cl.[7] .................................................. H03M 7/00

(52) U.S. Cl. ........................... 341/61; 341/50; 341/136; 341/144; 341/123; 341/143; 704/219; 704/223; 704/224; 704/228; 704/259; 704/264; 708/313; 708/376

(58) Field of Search ........................... 341/61, 50, 144, 341/136; 704/219, 223, 224, 228, 259, 264; 708/313, 376

(56) References Cited

U.S. PATENT DOCUMENTS

| | | | | | |
|---|---|---|---|---|---|
| 3,949,175 | A | * | 4/1976 | Tanizoe et al. | 704/503 |
| 4,922,537 | A | * | 5/1990 | Frederiksen | 704/212 |
| 5,389,923 | A | * | 2/1995 | Iwata et al. | 341/61 |
| 5,528,527 | A | | 6/1996 | Iwata et al. | |
| 5,621,404 | A | * | 4/1997 | Heiss et al. | 341/61 |
| 5,633,633 | A | * | 5/1997 | Nakano | 341/61 |
| 5,719,571 | A | * | 2/1998 | Akune et al. | 341/61 |
| 5,748,120 | A | * | 5/1998 | Yasuda | 341/61 |
| 5,786,778 | A | * | 7/1998 | Adams et al. | 341/61 |
| 5,794,186 | A | | 8/1998 | Bergstrom et al. | |
| 5,809,459 | A | | 9/1998 | Bergstrom et al. | |
| 5,892,468 | A | * | 4/1999 | Wilson et al. | 341/61 |
| 5,903,232 | A | | 5/1999 | Zarubinsky et al. | |
| 5,963,153 | A | | 10/1999 | Rosefield et al. | |
| 5,986,589 | A | | 11/1999 | Rosefield et al. | |
| 6,160,502 | A | * | 12/2000 | Ihm | 341/61 |
| 6,310,566 | B1 | | 10/2001 | McNeely | |

* cited by examiner

*Primary Examiner*—Michael Tokar
*Assistant Examiner*—Lam T. Mai
(74) *Attorney, Agent, or Firm*—Kenyon & Kenyon

(57) ABSTRACT

A method for upsampling a digital audio signal is described. The method includes receiving a first digital audio signal including samples and having a first sampling rate. The method also includes outputting at least one sample from the first digital audio signal as part of a second digital audio signal, the second digital audio signal having a desired second sampling rate, the second sampling rate being higher than the first sampling rate. The method also includes incrementing a counter for each sample from the first digital audio signal that is output as part of the second digital audio signal. The method also includes, when the counter exceeds a threshold number, inserting at least one synthetic sample as part of the second digital audio signal. The method also includes repeating the outputting, incrementing, and inserting until all the samples in the first digital audio signal have been output.

20 Claims, 5 Drawing Sheets

METHOD AND SYSTEM FOR SAMPLING RATE CONVERSION IN DIGITAL AUDIO APPLICATIONS

This application is a continuation of application Ser. No. 09/919,541, filed Jul. 31, 2001.

A portion of the disclosure of this patent document contains material is subject to copyright protection. The copyright owner has no objection to the facsimile reproduction by anyone of the patent document or patent disclosure as it appears in the Patent and Trademark Office patent file or records, but otherwise reserves all copyright rights whatsoever.

BACKGROUND INFORMATION

Recording and playing audio signals are a common part of many computer system applications. A computer system may receive a digital audio signal from a variety of sources, e.g., directly from a digital microphone or a hardware codec, from an analog-to-digital converter connected to an analog audio source, downloaded via a network, or from various digital audio storage media, including CD-ROMs, flash memory, digital tapes, etc. A received digital audio signal may be stored by the computer system, either in memory, or on some other storage media. A stored digital audio signal may then be output, e.g., played using a digital speaker, or transmitted via a network to another computer system.

A digital audio signal may include a sequence of coded "samples." Individual samples may define an output level from a digital sound producing device (e.g., a digital speaker), or the strength of a electrical signal transmitted to an analog speaker at a particular time. The samples may be received individually or in "blocks" of multiple samples. The number of samples per unit time in a signal may be referred to as the "sampling rate" of the signal. For example, standard CD audio sound is recorded at a sampling rate of 44.1 thousand samples per second. Each sample may include one or more coded signals, e.g., two separate signals may be provided in a sample for a two-channel stereo signal. Each sample in a signal may be coded as a binary word of a given length, e.g., 16-bit words are commonly used.

"Downsampling" may be used to play or record a received digital audio signal at a lower rate than it was received, by dropping samples from the signal. For example a hardware codec might produce a digital audio signal at a rate of 48K samples/sec, while the application being used stores digital audio signals at a rate of 24K samples/second. The 48K sample/sec "input" or "source" digital audio signal could then be downsampled to produce a stored 24K sample/second stored or "output" digital audio signal. Downsampling may be accomplished by removing samples from the received input digital audio signal. Downsampling may produce a lower rate output digital audio signal in the same format as the original input signal. Storing a signal at a lower rate may save significant amounts of storage space, which may be at a premium, particularly in an embedded system. A downsampled signal may be played at the lower output sampling rate. Alternatively, a downsampled signal may be "upsampled" to produce a higher rate digital audio signal.

When a stored digital audio signal is received by the computer system, for example by retrieving it from a storage media, the signal may be "upsampled" or converted to a higher sampling rate than the stored signal by adding samples to the signal. The upsampled signal may have the same format as the received signal. Upsampling may be needed where an output device only can process a signal at a given rate, e.g., 44.1 KHz, and the received digital audio signal has been recorded by the computer system at a lower rate, e.g., 8 KHz.

A theoretical analysis of upsampling and downsampling is provided in A. V. Oppenheim, and R. W. Schafer, Discrete—Time Signal Processing, Prentice Hall, 1989 and also in S. K. Mitra, Digital Signal Processing, McGraw-Hill, 1998. Conventional upsampling methods use specialized hardware or make intensive use of floating point operations in order to interpolate or otherwise reconstruct the missing samples that may be provided when a received signal is upsampled. Using specialized hardware has several disadvantages. Extra hardware adds to the cost, size, and power consumption of a computer system. Furthermore, many specialized hardware units may be able to upsample only to a particular fixed output rate, making the computer system less flexible, or requiring different pieces of hardware for different rates. Software upsampling, while more flexible than hardware upsampling, may require a large number of floating point operations. Particularly in so-called "embedded computer systems", computing capacity may be limited and floating-point hardware may not be included. If the computer system does not have a floating point processor, simulating floating point operations with a fixed point processor may be extremely computationally intensive.

SUMMARY

In accordance with an example embodiment of the present invention, a method is provided that includes (a) receiving a first digital audio signal including samples and having a first sampling rate, (b) outputting at least one sample from the first digital audio signal as part of a second digital audio signal, the second digital audio signal having a desired second sampling rate, the second sampling rate being higher than the first sampling rate, (c) incrementing a counter for each sample from the first digital audio signal that is output as part of the second digital audio signal, (d) when the counter exceeds a threshold number, inserting at least one synthetic sample as part of the second digital audio signal, and (e) repeating (b), (c), and (d), until all the samples in the first digital audio signal have been output.

Also in accordance with an example embodiment of the present invention, a system is provided that includes a counter, a threshold, and an upsampling mechanism, the upsampling mechanism configured (a) to receive a first digital audio signal including samples and having a first sampling rate, (b) to output at least one sample from the first digital audio signal as part of a second digital audio signal, the second digital audio signal having a desired second sampling rate, the desired second sampling rate being greater than the first sampling rate, (c) to increment the counter for each sample from the first digital audio signal that is output as part of the second digital audio signal in (b), (d) when the counter exceeds the threshold, to insert at least one synthetic sample as part of the second digital audio signal, and (e) to repeat (b), (c), and (d) until all samples in the first digital audio signal have been output.

Also in accordance with an example embodiment of the present invention, an article of manufacture is provided, the article of manufacture including a computer-readable medium having stored thereon instructions adapted to be executed by a processor, the instructions which, when executed, define a series of steps to be used to control a method for upsampling a digital audio signal, the steps including: receiving a first digital audio signal including samples and having a first sampling rate, outputting at least one sample from the first digital audio signal as part of a second digital audio signal, the second digital audio signal having a desired second sampling rate, the second sampling rate being higher than the first sampling rate, incrementing a counter for each sample from the first digital audio signal that is output as part of the second digital audio signal, when the counter exceeds a threshold number, inserting at least one synthetic sample as part of the second digital audio signal, and repeating the steps of outputting, incrementing, and inserting, until all the samples in the first digital audio signal have been output.

Also in accordance with an example embodiment of the present invention, a method of downsampling a digital audio signal is provided that includes (a) receiving a first digital audio signal including samples and having a first sampling rate, (b) outputting at least one sample from the first digital audio signal as part of a second digital audio signal, the second digital audio signal having a desired second sampling rate, the second sampling rate being less than the first sampling rate, (c) incrementing a counter for each sample from the first digital audio signal that is output as part of the second digital audio signal, (d) when the counter exceeds a threshold number, skipping at least one sample from the first digital audio signal; and (e) repeating (b), (c) and (d) until all the samples in the first digital audio signal have been output or skipped.

Also in accordance with an example embodiment of the present invention, a system is provided that includes a counter, a threshold number, and a downsampling mechanism, the downsampling mechanism configured (a) to receive a first digital audio signal, the first digital audio signal including samples and having a first sampling rate, (b) to output at least one sample from the first digital audio signal as part of a second digital audio signal, the second digital audio signal having a desired second sampling rate, the second sampling rate being less than the first sampling rate, (c) to increment a counter for each sample from the first digital audio signal that is output as part of the second digital audio signal, (d) when the counter exceeds thethreshold number, to skip at least one sample from the first digital audio signal, and (e) to repeat (b), (c), and (d), until all samples in the first digital audio signal have been output or skipped.

Also in accordance with an example embodiment of the present invention, an article of manufacture is provided, the article of manufacture including a computer-readable medium having stored thereon instructions adapted to be executed by a processor, the instructions which, when executed, define a series of steps to be used to control a method for downsampling a digital audio signal, said steps including receiving a first digital audio signal including samples and having a first sampling rate, outputting at least one sample from the first digital audio signal as part of a second digital audio signal, the second digital audio signal having a desired second sampling rate, the second sampling rate being less than the first sampling rate, incrementing a counter for each sample from the first digital audio signal that is output as part of the second digital audio signal, when the counter exceeds a threshold number, skipping at least one sample from the first digital audio signal, and repeating the steps of outputting, incrementing and skipping until all the samples in the first digital audio signal have been output or skipped.

Also in accordance with an example embodiment of the present invention, a method of receiving and playing back a digital audio signal is provided, the method including, (a) receiving a first digital audio signal including samples and having a first sampling rate, (b) storing at least one sample from the first digital audio signal as part of a second digital audio signal, the second digital audio signal having a desired second sampling rate, the second sampling rate being less than the first sampling rate, (c) incrementing a first counter for each sample from the first digital audio signal that is stored as part of the second digital audio signal, (d) when the first counter exceeds a first threshold number, skipping at least one sample from the first digital audio signal, (e) repeating (b), (c) and (d) until all the samples in the first digital audio signal have been output or skipped, (f) retrieving the second digital audio signal, (g) outputting at least one sample from the second digital audio signal as part of a third digital audio signal, the third digital audio signal having a desired third sampling rate, the third sampling rate being higher than the second sampling rate, (h) incrementing a second counter for each sample from the second digital audio signal that is output as part of the third digital audio signal, (i) when the second counter exceeds a second threshold number, inserting at least one synthetic sample as part of the third digital audio signal; and (j) repeating (g), (h), and (i), until all the samples in the second digital audio signal have been output.

DETAILED DESCRIPTION

Example Downsampling Procedure

Figure 1:
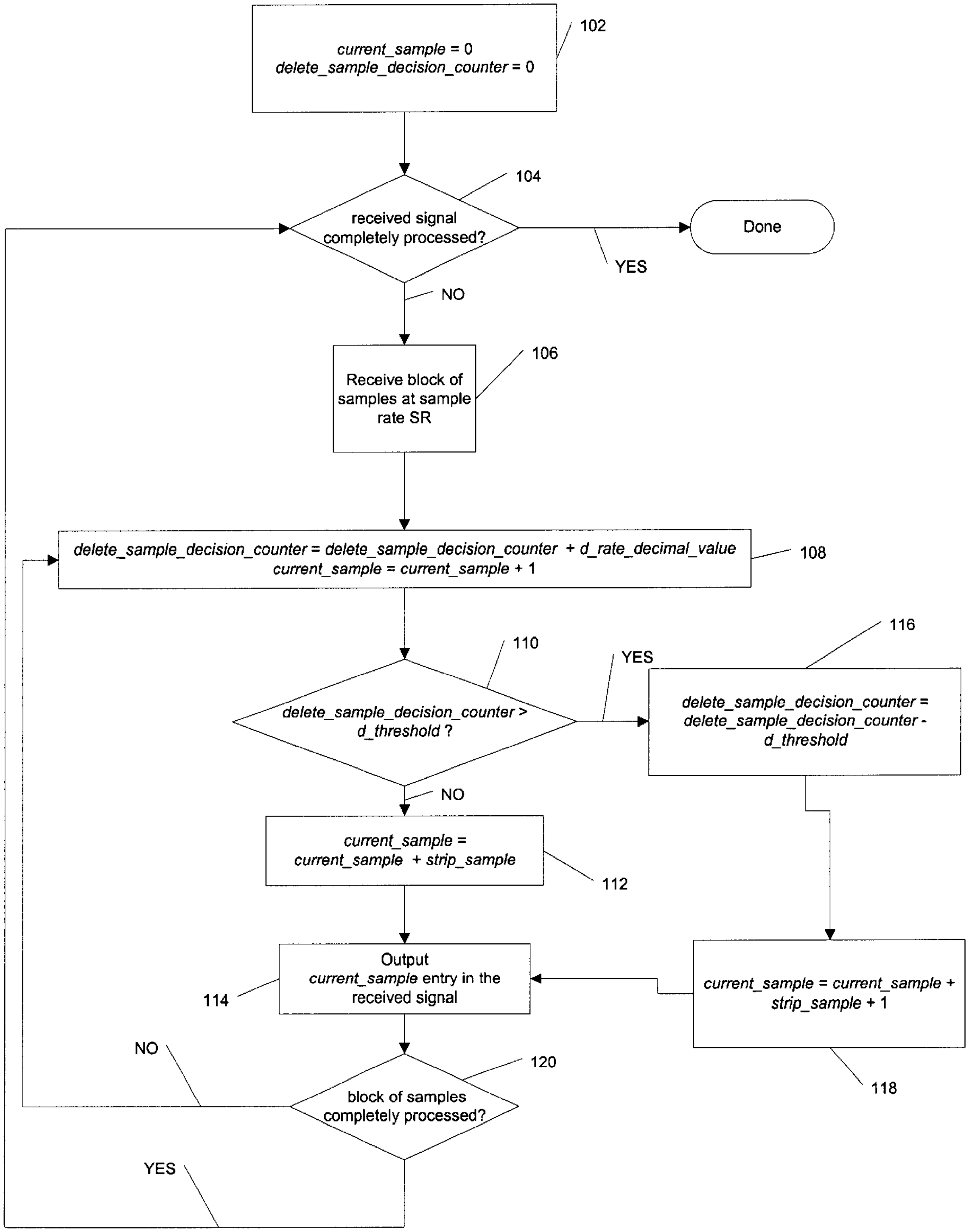
FIG. 1 illustrates an example downsampling procedure, according to an example embodiment of the present invention.

FIG. 1 illustrates an example downsampling procedure, according to an example embodiment of the present invention. The example downsampling procedure may receive a digital audio signal at a source sampling rate (SR) and may produce an output digital audio signal at a second lower output sampling rate (OR). The output digital audio signal may be stored in memory or other storage media or may be transmitted for output to a hardware audio output device. The output digital audio signal may have the same duration and format as the received digital signal, albeit at a lower sampling rate, i.e., fewer samples are used to produce an audio signal of the same duration.

Before the example downsampling procedure begins, the source rate at which digital audio input is received and the output rate at which digital audio data will be stored may be determined. The source rate may be determined by the identity of the source of the digital audio input, i.e., some hardware devices or input file formats may only provide digital audio input at certain fixed rates rates. This information may be maintained in a table in the computer's operating system. Alternatively, a header in a received digital audio input file may indicate the sampling rate of the digital audio signal contained in the file. For example file headers in both ".wav" and ".au" audio files include sample rate, number of channels, number of bits per sample, and encoding format (e.g., big-endian, little-endian, signed, unsigned). The output sampling rate may be pre-defined for a particular storage media where the output signal is to be stored or may be specified by the user or application that invokes the example downsampling procedure.

Once the source and output sampling rates have been determined, the example procedure for downsampling may determine constants that may be used during the example downsampling procedure to determine how many samples are dropped, and which samples are dropped. If the downsampling ratio, i.e., the sampling rate of the source sample divided by the sampling rate of the output sample, is less than 2:1, then consecutive samples will not be dropped during the example downsampling procedure. If the downsampling ratio is greater than 2:1, then consecutive samples may be dropped.

A deletion trigger point or deletion threshold may be used in controlling the example downsampling procedure. An example of the deletion threshold in the example downsampling procedure is the variable denoted d_threshold. The d_threshold value in the example downsampling procedure is 1,000,000. However, it will be appreciated that other d_threshold values could be used. The use of a larger threshold may result in more exact handling of the ends of files, and more accurate dithering of the added samples in the output signal reducing distortion. However, in the case of 8-bit or 16-bit processors, a larger threshold may require using multiple variables or a dedicated counter register in order to track and control the example downsampling procedure.

A variable that is a function of the ratio of the source sample rate to the output sample rate, and is denoted here as "d_rate_decimal_value", may be determined. The d_rate_decimal_value variable may be used to increment the deletion counter used in the example downsampling procedure to track when samples should be deleted. In the example embodiment, d_rate_decimal_value may computed by using the formula:

$$d\_\text{rate\_decimal\_value}=\lfloor((SR/OR)-\lfloor(SR/OR)\rfloor)*\text{i d\_threshold}\rfloor$$

where $\lfloor\ \rfloor$ denotes the integer floor function.

A variable, denoted here as strip_sample, may be used to indicate the base number of samples that are normally deleted for every sample that is output in the output signal. In the example embodiment, the value of strip_sample may be determined using the formula:

$$\text{strip\_sample}=\lfloor SR/OR\rfloor 1.$$

It will be appreciated that the value of the strip_sample variable need not always be the actual number of samples deleted after each output sample, but may be a base number that may be increased after some output samples. The example downsampling procedure may remove more samples after some output samples, and fewer after other output samples. Note that strip_sample may be zero, if the downsampling ratio is less than 2:1. When the downsampling ratio is less than 2:1, only a fraction of the samples in the output signal may have the following sample in the source signal deleted.

In step 102, two counters used in the example downsampling procedure may be initialized. The first counter, denoted "current_sample", may be used to indicate the sample in the source signal that currently is the next candidate sample to be stored as part of the output signal. It will be appreciated that depending on the data structure used to store digital audio signals, current_sample may also be implemented as a pointer, or other conventional indication of which sample to output next. The second counter, denoted "delete_sample decision_counter", may be used in the example downsampling procedure to track when samples are deleted or dropped.

In step 104, the example procedure may check to see whether the entire source signal has been processed. This may be accomplished by testing for an "end of file" character, by comparison with a value in a signal header that indicates the length of the signal, by an indication that the entire audio signal (or audio signal file) has been received from a hardware device or the operating system, or any other conventional way of determining that the signal has been completely processed. If the entire audio signal has been completely processed, the example downsampling procedure may be completed. Otherwise the example downsampling procedure may continue with step 106.

In step 106, a block of samples from the source signal may be received by the example downsampling procedure. It will be appreciated that the size of the received blocks of multiple samples may vary depending on how the source signal was stored or processed before being received. Common application block sizes may include powers of 2, e.g., 4096 or 8192 samples.

In step 108, the current sample counter is incremented. Once incremented, the current_sample may indicate the next sample that is a candidate for being output. The sample deletion counter may be incremented by adding the d_rate_decimal_value.

In step 110, the sample deletion counter may be tested by comparing it with the deletion threshold, e.g., the variable denoted d_threshold. If the delete_sample_decision_counter exceeds the threshold, an extra sample may be deleted, so the example downsampling procedure may continue with step 116. Otherwise, only the base number of samples may be deleted, so the example downsampling procedure may continue with step 112.

In step 112, a base number of samples are skipped by incrementing the current sample counter by the value of strip_sample. It will be appreciated that additional steps may be required to correctly handle the situation where the skipped samples include the last sample in the current block. It will also be appreciated that, if the blocks are relatively large, that correct handling of the samples at the end of the blocks may not be crucial to perceived audio performance, and so completely correct handling of samples around the ends of blocks may not be necessary in many applications.

In step 114, the current sample may be output as part of the output signal, e.g., by storing it in memory in a file containing the output signal.

In step 116, the sample deletion count is adjusted by subtracting the value of d_threshold. This adjustment may allow the downsampling procedure to continue without resetting the sample deletion counter.

In step 118, strip_sample+1 samples may be deleted by incrementing the current_sample. Because the d_threshold value was exceeded by the delete_sample_decision_counter, an extra sample may be deleted, beyond the base number of samples that would usually be deleted if the threshold had not been exceeded.

In step 120, if the block of samples has been completely processed, the example downsampling procedure may continue with step 104, where another block of samples may be received if the source signal has not been completely processed. If the block of samples has not been completely processed, the example downsampling procedure may continue with step 108, and determine the next sample that will be output from the current block of samples.

It will be appreciated that different block handling or buffering techniques could be used in the example downsampling procedure. For example, the example downsampling procedure could be modified to process an source audio signal that is received one sample at a time, rather than in blocks.

It will also be appreciated that, if the source rate is not an integer multiple of the output rate, the samples in the output signal may not be exactly uniformly spaced in the source signal. This may cause some flutter or other distortion in the output signal. Other procedures for dithering may be used in this situation besides the two counter procedure described above, e.g., samples could be selected randomly or pseudo-randomly.

It will be appreciated that the steps of the example downsampling procedure, described above, could be defined as a series of instructions adapted to be executed by a processor, and these instruction could be stored on a computer-readable medium, e.g., a tape, a disk, a CD-ROM.

Example Upsampling Procedure

Figure 2:
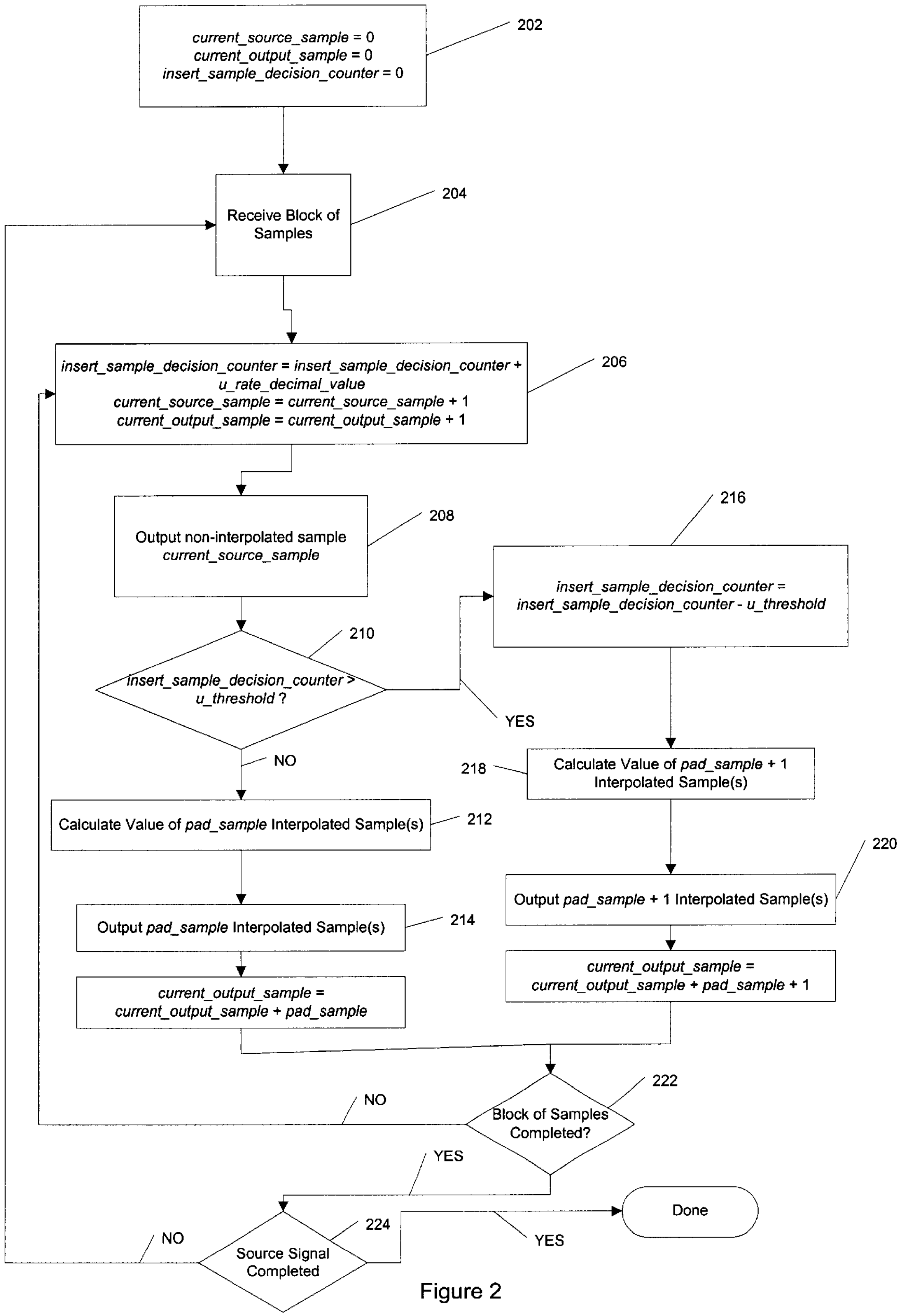
FIG. 2 illustrates an example upsampling procedure, according to an example embodiment of the present invention.

FIG. 2 illustrates an example upsampling procedure, according to an example embodiment of the present invention. The example upsampling procedure receives a digital audio signal at a source sampling rate (SR) and produces an output digital audio signal at a second higher output sampling rate (OR). The received digital audio signal may have been created using the example downsampling procedure described above. The output digital audio signal may be transmitted for output to an audio output device, transmitted to another computer system, or saved in memory or other storage media. The output digital audio signal may have the same duration and format as the received digital signal, albeit at a higher sampling rate, i.e., more samples are used to produce an audio signal of the same duration.

Before the example upsampling procedure begins, the source rate of the received signal digital audio and the output rate that digital audio output signal will be played may be determined. The source rate may be determined by the identity of the source of the digital audio input, i.e., some hardware devices or input file formats may only provide digital audio input at certain fixed rates. This information may be maintained in a table in the computer's operating system. Alternatively, a header in a received digital audio source file may indicate the sampling rate of the digital audio signal contained in the file (e.g., in a .wav file). The output sampling rate may be pre-defined for a particular output device or may be specified by the user or application that invokes the example downsampling procedure.

Once the source and output sampling rates have been determined, the example procedure for upsampling may calculate constants that may be used during the example upsampling procedure to determine how many samples are added, and which source samples have samples added after them. If the upsampling ratio, i.e., the sampling rate of the output signal divided by the sampling rate of the source signal, is less than 2:1, then not all source samples may have a synthetic sample added after them, and only a single synthetic sample may be added after each source sample. If the upsampling ratio is greater than 2:1, then multiple samples in a row may be added after a single sample, and all source samples will generally have a synthetic sample added after them.

The example upsampling procedure may use an insertion or interpolation threshold value, which may be provided as a variable denoted u_threshold. The value of u_threshold in the example upsampling procedure is 1,000,000. However, it will be appreciated that other threshold values could be used. The use of a larger threshold may result in more exact handling of the ends of files, and more accurate dithering of the output signal, reducing distortion.

A "u_rate_decimal_value" may be determined. The u_rate_decimal_value may be a function of the ratio of the output sampling rate to the source sampling rate. The u_rate_decimal_value may be used to increment the interpolation counter used in the example upsampling procedure. The u_rate_decimal_value may determined by the formula:

$$u\_rate\_decimal\_value=\lfloor((OR/SR)-\lfloor(OR/SR)\rfloor)*u\_threshold\rfloor$$

where ⌊ ⌋ denotes the integer floor function.

A pad_sample variable indicates the base number of synthetic samples that are normally interpolated for every source sample that is output in the output signal. The value of pad_sample may be determined using the formula:

$$pad\_sample=\lfloor OR/SR\rfloor-1.$$

It will be appreciated that the pad_sample value need not always be the actual number of synthetic samples interpolated after each source sample that is output, but may be a base number that may be increased after some source samples. The example upsampling procedure may dither, adding more samples after some source samples, and fewer after other source samples. Note that the pad_sample value may be zero, if the upsampling ratio is less than 2:1. When the upsampling ratio is less than 2:1, only a fraction of the source samples in the output signal may have interpolated synthetic samples immediately following them in the output signal.

It may also be useful to pre-calculate "scale factor" values for use in interpolation in the example upsampling procedure. The scale factor for a given number of interpolated samples is the full range of a signal sample divided by the number of interpolated samples plus one. For example, for a 16 bit signal, the full range of a sample is 65,536, and the scale factor for one interpolated sample would be 32,768, i.e., the space between the two source samples is divided in half and the interpolated sample is linearly interpolated between them. For two interpolated samples the scale factor would be 21,845, i.e., interval between the source samples is divided into thirds. It will be appreciated that the scale factors need not be exact, but may be approximations. It will also be appreciated that if the range of possible upsampling ratios is known, the scale factors may be hardcoded in a program to execute the example procedure. The appropriate scaling factor may be selected when the number of interpolated samples is known, e.g., by using a case statement or a look-up table.

Once the constants that have been described above have been determined, the example upsampling procedure may begin.

In step 202, counters used in the example upsampling procedure may be initialized. Three counters may be used. The first counter is current_source_sample, which may be used to track the sample from the source signal that is the next candidate for output. The second counter is current_output_sample, that may be used to track the position of the next sample to be output in the output signal. It will be appreciated that the current_output_sample counter may be higher than the current_source_sample, because upsampling causes extra samples to be inserted in the output signal in a signal of a given time duration. Third, a counter variable, denoted here insert_sample_decision_counter, may be used to track when extra samples are added between source samples in the output signal. It will be appreciated that other conventional mechanisms for tracking the current source and output sample may be used, e.g., pointers may be used in place of a counter.

In step 204, a block of samples from the source signal may be received by the example upsampling procedure. These samples may be received by reading them from a storage media, inputting from a hardware audio input device, or they may be downloaded via a network. It will be appreciated that the example upsampling procedure is designed for blocks that contain a relatively large number of samples, and if blocks are small or if samples are received one at time, the example upsampling procedure may require modifications to more accurately handle samples at the end of blocks.

In step 206 the current source sample and current output sample counters may be incremented. The interpolation counter may be incremented by adding the u_rate_decimal_value.

In step 208, the current source sample may be output.

In step 210, the interpolation counter may be tested to determine whether it exceeds the value of u_threshold. If the interpolation counter does not exceed the value of u_threshold, then the normal number of synthetic samples that follow the current source sample may be output. The example upsampling procedure may continue with step 212. Otherwise, if the interpolation counter exceeds the value of u_threshold, an extra synthetic sample may be output, and the example upsampling procedure continues with step 216.

In step 212, the example upsampling procedure may calculate synthetic samples that may be output as part of the output signal after the current source sample. pad_sample synthetic samples may be calculated; thus if the value of pad sample is zero, no synthetic samples will be calculated. The synthetic samples may be calculated by linearly interpolating between the current source sample and the next sample in the source signal.

First, the difference between the current source sample and the next source sample may be computed. This difference value may then be multiplied by the scale factor value for the number of synthetic samples that will be added. This product may then be integer divided by the range of the signal, e.g., by right shifting the bits of the result. For example, for a 16 bit range, the product would be right shifted by 16. The successive interpolated values may then be obtained by adding the delta value. Thus the first interpolated value is the current_source_sample+delta, the second interpolated value may be the current_source_sample+2*delta, etc.

For example, for a 16-bit sample range, and j interpolated values between two source samples, each successive synthetic sample between the two source samples may be calculated according to the following formula:

$$\text{j-th synthetic value} = \text{proceeding source sample} + j * [((\text{succeeding source sample} - \text{preceding source sample}) * \text{scale factor}[j]) >> 16]$$

where ">>" denotes a bitwise right shift operator. It will be appreciated that this formula can readily be modified for different sample ranges.

In step 214, the example upsampling procedure may output the pad sample interpolated samples that were calculated in step 212. It will be appreciated that other conventional approaches to outputting these samples may be used, e.g., different block or buffer sizes may be used for the output signal.

In step 216, the interpolation counter may be adjusted by subtracting the value of u_threshold.

In step 218, pad_sample+1 interpolated values may be calculated. The same approach may be used as in step 212, except that one extra sample is calculated, and the scale factor used may be different, to reflect the larger number of calculated interpolated samples.

In step 220, the interpolated values may be output.

In step 222, the example downsampling procedure may determine whether the block of samples that was received has been completely processed. If it has not, the example procedure returns to step 206 to process the next source sample in the block of samples. Otherwise, the example upsampling procedure may continue with step 224.

In step 224, the example downsampling procedure may determine whether the entire source signal has been processed. This may be accomplished by any conventional approach, e.g., comparing the current_source_sample counter with a known size for the source signal that was received in the source signal header, receiving an "end of signal" or "end of file" indication from an input device, etc. If the signal has not been completed, the example upsampling procedure may continue with step 204, receiving another block of samples. Otherwise the example upsampling procedure may be completed.

It will be appreciated that the steps of the example upsampling procedure, described above, could be defined as a series of instructions adapted to be executed by a processor, and these instruction could be stored on a computer-readable medium, e.g., a tape, a disk, a CD-ROM.

Example Computer System

Figure 3:
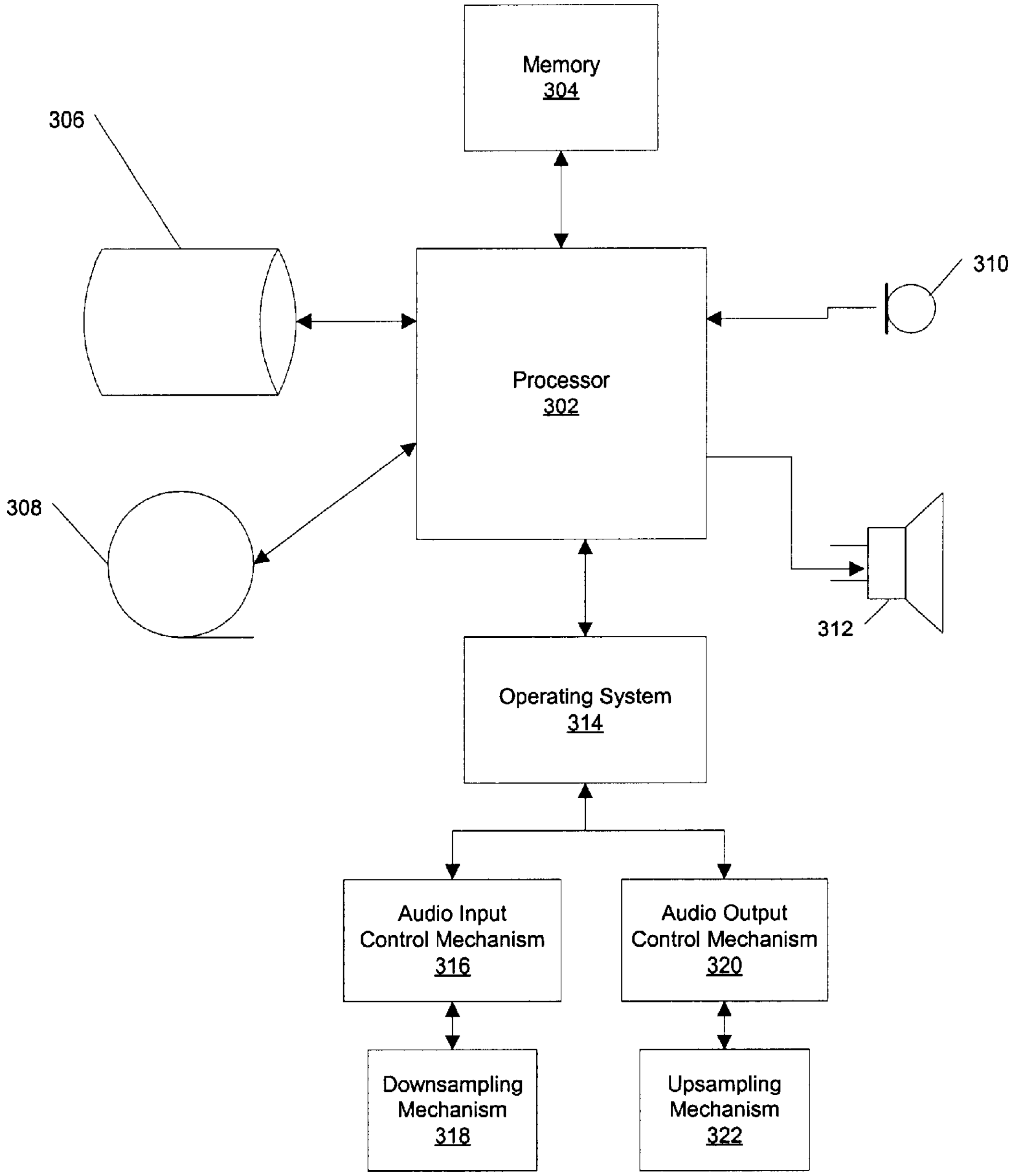
FIG. 3 illustrates an example computer system, according to an example embodiment of the present invention.

FIG. 3 illustrates an example computer system, according to an example embodiment of the present invention. The example computer system may include facilities for both recording and playing digital audio signals. The example computer system may include a processor 302. The processor need not include a hardware floating point arithmetic capability. The computer system may include one or more storage subsystems. The storage subsystems may include RAM memory 304, other storage subsystems including bubble or flash memory, disks 306, a CD drive 308, or other conventional equipment for the storage and/or retrieval of digital data, e.g., a digital tape drive.

The example computer system may include an audio input source 310, which may include a digital microphone, a/d converter, hardware codec, or other elements from which the system may receive digital audio signals. The system may also receive digital audio signals by downloading them from a network, or by reading files from pre-recorded digital media, e.g., CD-ROMS, MP3 files received from the Internet, or any other digital audio input source.

The example computer system may include an audio output device 312, such as a speaker, headphones, or other device for outputting a digital audio signal. The example computer system may include an operating system 314. Traditional multitasking operating systems (e.g.,. UNIX, Windows, VxWorks) have been implemented in computing environments to provide a way to allocate the resources of the computing environment (e.g., CPU, memory, Input/Output (I/O) devices) among various user applications that may be running simultaneously in the computing environment. The operating system 314 may include a number of functions (executable code) and data structures that may be used to implement the resource allocation services of the operating system, and to control the operation of the resources.

The operating system 314 may include an audio input control mechanism 316. The audio input control mechanism 316 may control applications' access to and use of the audio input source, as well as providing other functions needed by applications to process audio input.

The audio input control mechanism 316 may include a downsampling mechanism 318. The downsampling mechanism 318 may provide functions for downsampling a received digital audio signal before the signal is stored. The downsampling mechanism 318 may include functions that provide the example downsampling procedure described above, allowing signals to be downsampled without using floating point operations.

The operating system 314 may include an audio output control mechanism 320. The audio output control mechanism 320 may control applications' access to and use of the audio output device 312, as well as providing other functions needed by applications to generate and process audio outputs.

The audio output control mechanism 320 may include an upsampling mechanism 322. The upsampling mechanism 322 may provide functions for upsampling a recorded digital audio signal before the signal is output. The upsampling mechanism 322 may provide the example upsampling procedure described above, allowing signals to be upsampled without using floating-point operations.

Figure 4:
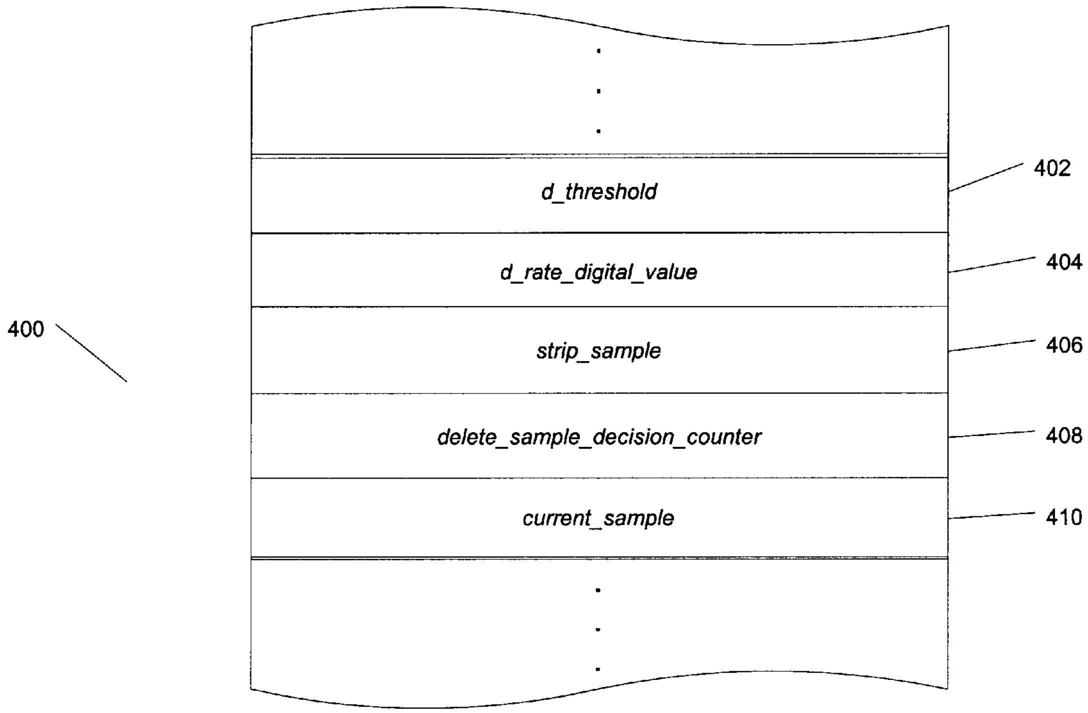
FIG. 4 illustrates an example downsampling mechanism data structure, according to an example embodiment of the present invention.

FIG. 4 illustrates an example downsampling mechanism data structure 400, according to an example embodiment of the present of the invention. The downsampling mechanism data structure 400 may be provided as part of the downsampling mechanism 318, described above.

The example downsampling mechanism data structure 400 may include a threshold variable 402, denoted here d_threshold. The threshold variable 402 may be used during the example downsampling procedure to help control when extra samples are deleted from a digital audio signal being downsampled.

The example downsampling mechanism data structure 400 may include a variable 404, denoted here d_rate_digital_value, whose value is used to increment a deletion counter used in the example downsampling procedure. The d_rate_digital_value variable 404 may be configured to have a value that is a function of the ratio of the source sampling rate to the output sampling rate.

The example downsampling mechanism data structure 400 may include a variable 406, denoted here strip_sample, that may be configured to indicate the base number of samples in the source signal that are deleted after each source sample that is actually output from the example downsampling procedure. The strip_sample variable 406 may be configured to be an increasing function of the downsampling ratio.

The example downsampling mechanism data structure 400 may include a counter 408, denoted here delete_sample_decision_counter. The delete_sample_decision_counter counter 408 may be configured to serve as a counter for use in controlling when samples are deleted in the example downsampling procedure.

The example downsampling mechanism data structure 400 may include a counter 410, denoted here current_sample. The current_sample counter 410 may be used to track which sample in the source signal is currently being processed, e.g., which sample is currently being considered as the next sample to be output as part of the output signal by the example downsampling procedure.

It will be appreciated that any conventional data structure may be used to store the variables included in the example downsampling mechanism data structure, e.g., a table, a list, etc. It will be appreciated that other variables may also be included in the exampling downsampling mechanism data structure 400, e.g., additional information about the source or output signals, information about sampling rates, resource usage, etc.

Figure 5:
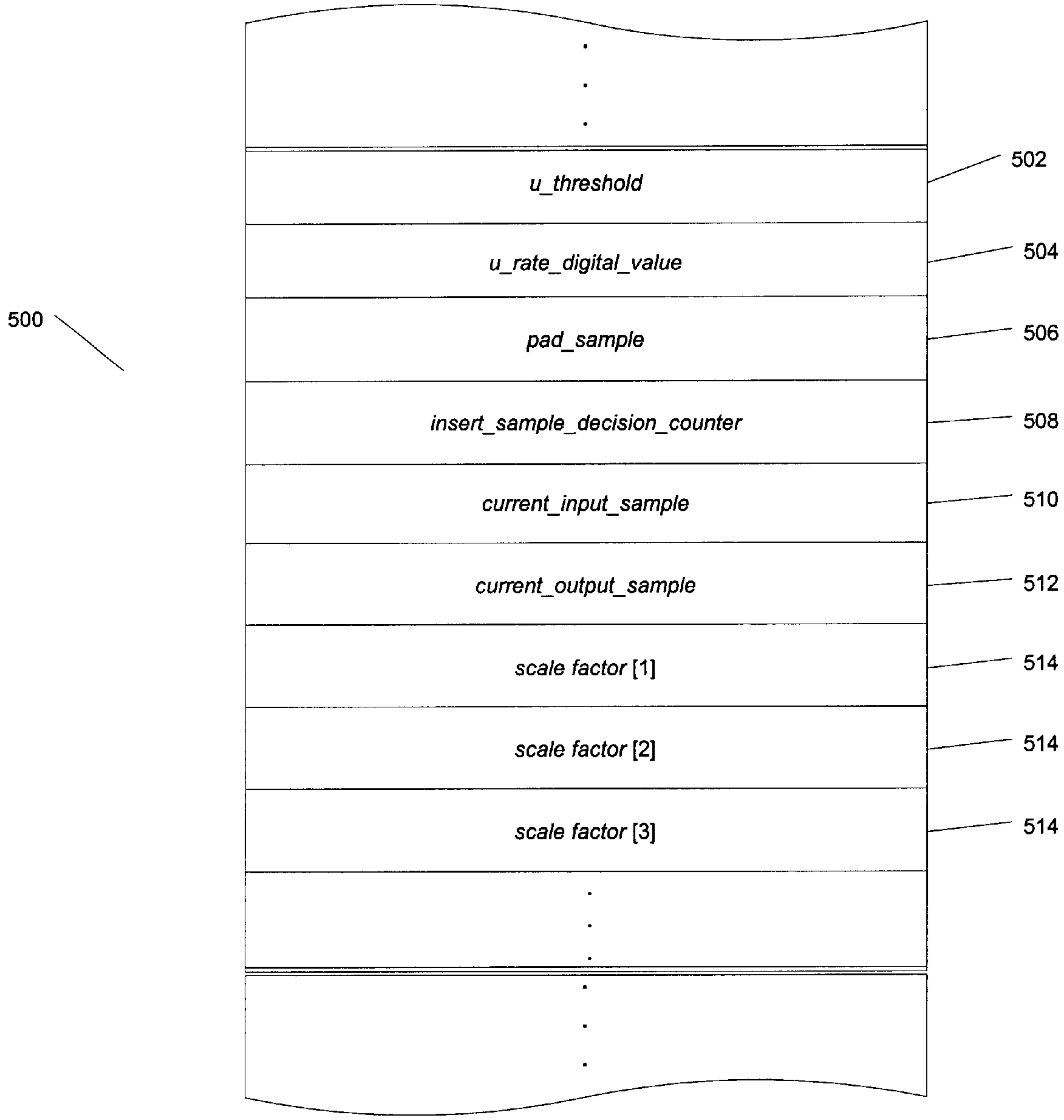
FIG. 5 illustrates an example upsampling mechanism data structure, according to an example embodiment of the present invention.

FIG. 5 illustrates an example upsampling mechanism data structure 500, according to an example embodiment of the present of the invention. The upsampling mechanism data structure 500 may be provided as part of the upsampling mechanism 322, described above.

The example upsampling mechanism data structure 500 may include a threshold variable 502, denoted here u_threshold. The threshold variable 502 may be used during the example downsampling procedure to help control when extra samples are added to a digital audio signal being upsampled.

The example upsampling mechanism data structure 500 may include a variable 504, denoted here u_rate_digital_value, whose value is used to increment an interpolation counter used in the example upsampling procedure. The u_rate_digital_value variable 504 may be configured to have a value that is a function of the ratio of the output sampling rate to the source sampling rate.

The example upsampling mechanism data structure may include a variable 506, denoted here pad_sample, that may be configured to indicate the base number of samples in the source signal that are added after each source sample that is actually output from the example upsampling procedure. The pad_sample variable 506 may be configured to be an increasing function of the upsampling ratio.

The example upsampling mechanism data structure may include a counter 508, denoted here insert_sample_decision_counter. The insert_sample_decision_counter counter 508 may be configured to serve as a counter for use in controlling when samples are added in the example upsampling procedure.

The example upsampling mechanism data structure may include counters 510 and 512, denoted here current_input_sample and current_output_sample. The current_input_sample counter 510 may be used to track which sample in the source signal is currently being processed, e.g., which source sample is currently being considered as the next sample to be output as part of the output signal by the example downsampling procedure. The current_output_sample counter 512 may be used to track which sample in the output signal is currently being output. It will be appreciated that, because upsampling adds samples to the output signal, the current_output_sample counter 512 will generally be larger than the current_input_sample counter 510 after the first few samples in the input and output signals have been processed.

The example upsampling mechanism data structure 500 may also include one or more scale factors 514. For each possible number of interpolated samples between two source samples, a corresponding scaling factor 514 may be stored in the upsampling mechanism data structure 500. Although only three are shown, it will be appreciated that more scaling factors may be included in the example upsampling mechanism data structure 500. The number of scaling factors needed may vary depending on the range of possible upsampling ratios in the system. The scaling factors 514 may be stored as an array, indexed table, or other conventional data structure that allows the appropriate scale factor to be accessed by the example upsampling procedure. It will be appreciated that scaling factors might also be hardcoded and stored as part of code used in providing the example upsampling mechanism, rather than as data in the upsampling mechanism data structure 500. Scaling factors might also be computed during an upsampling procedure, although this would incur some computational overhead.

It will be appreciated that any conventional data structure may be used to store the variables included in the example upsampling mechanism data structure, e.g., a table, a list, etc. It will be appreciated that other variables may also be included in the exampling upsampling mechanism data structure, e.g., additional information about the source or output signals, information about sampling rates, resource usage, etc.

Modifications

In the preceding specification, the present invention has been described with reference to specific example embodiments thereof. It will, however, be evident that various modifications and changes may be made thereunto without departing from the broader spirit and scope of the present invention as set forth in the claims that follow. The specification and drawings are accordingly to be regarded in an illustrative rather than restrictive sense.

What is claimed is:

1. A system, comprising:

a processor;

at least one storage system coupled to the processor;

an audio output control mechanism stored in the at least one storage system and configured to receive a first digital audio signal having samples;

an upsampling mechanism stored in the at least one storage system and configured to (a) determine a first sampling rate of the first digital audio signal, (b) output at least one sample from the first digital audio signal as part of a second digital audio signal, the second digital audio signal having a second sampling rate, the second sample rate being higher than the first sampling rate, (c) increment a first counter for each sample from the first digital audio signal that is output as part of the second digital audio signal, (d) insert at least one synthetic sample as part of the second digital audio signal when the first counter exceeds a threshold number, (e) repeat (b), (c) and (d) until all samples in the first digital audio signal have been output.

2. The system of claim 1, further comprising:

an upsampling data structure stored in the storage system, accessible by the upsampling mechanism, and including a first variable to store the threshold number, a second variable to store a value used to increment the first counter, a third variable to store the first counter, a fourth variable to store a second counter to track the samples of the first digital audio signal, and a fifth variable to store a third counter to track the samples of the second digital audio signal.

3. The system of claim 2, wherein the value used to increment the first counter is a function of the ratio of the first sampling rate and the second sampling rate.

4. The system of claim 2, wherein the upsampling data structure further includes at least one scale factor.

5. The system of claim 2, wherein the upsampling data structure is stored in the at least one storage system as one of a list and a table.

6. The system of claim 1, wherein the first digital audio signal is stored in the at least one storage system.

7. The system of claim 1, further comprising an operating system stored in the at least one storage system and configured to control the operation of the processor.

8. The system of claim 1, further comprising:

an audio output device coupled to the processor;

wherein the audio output control mechanism is further configured to control the audio output device.

9. The system of claim 8, wherein the second digital audio signal is output to the audio output control mechanism, and provided by the audio output control mechanism to the audio output device.

10. An operating system, comprising:

a number of functions configured to perform at least one of resource allocation and control of resources;

an audio output control mechanism configured to receive a first digital audio signal having samples; and an upsampling mechanism configured to (a) determine a first sampling rate of the first digital audio signal, (b) output at least one sample from the first digital audio signal as part of a second digital audio signal, the second digital audio signal having a second sampling rate, the second sample rate being higher than the first sampling rate, (c) increment a first counter for each sample from the first digital audio signal that is output as part of the second digital audio signal, (d) insert at least one synthetic sample as part of the second digital audio signal when the first counter exceeds a threshold number, (e) repeat (b), (c) and (d) until all samples in the first digital audio signal have been output.

11. A system, comprising:

a processor;

at least one storage system coupled to the processor;

an audio input control mechanism stored in the at least one storage system and configured to receive a first digital audio signal having samples;

a downsampling mechanism stored in the at least one storage system and configured to (a) determine a first sampling rate of the first digital audio signal, (b) output at least one sample from the first digital audio signal as part of a second digital audio signal, the second digital audio signal having a second sampling rate, the second sample rate being lower than the first sampling rate, (c) increment a first counter for each sample from the first digital audio signal that is output as part of the second digital audio signal, (d) skip at least one sample from the first digital audio signal when the first counter exceeds a threshold number, (e) repeat (b), (c) and (d) until all samples in the first digital audio signal have been outputted or skipped.

12. The system of claim 11, further comprising:

a downsampling data structure stored in the storage system and including a first variable to store the threshold number, a second variable to store a value used to increment the first counter, a third variable to store a number of samples to skip, a fourth variable to store the first counter, and a fifth variable to store a second counter to track the samples of the first digital audio signal.

13. The system of claim 12, wherein the value used to increment the first counter is a function of the ratio of the first sampling rate and the second sampling rate.

14. The system of claim 12, wherein the downsampling data structure is stored in the at least one storage system as one of a list and a table.

15. The system of claim 11, wherein the second digital audio signal is stored in the at least one storage system.

16. The system of claim 11, wherein the first digital audio signal is stored in the at least one storage system.

17. The system of claim 11, further comprising an operating system stored in the at least one storage system and configured to control the operation of the processor.

18. The system of claim 11, further comprising:

an audio input device coupled to the processor;

wherein the first digital audio signal is received by the audio input device and provided to the audio input control mechanism.

19. An operating system, comprising a number of functions configured to perform at least one of resource allocation and control of resources;

an audio input control mechanism configured to control an audio input device; and a downsampling mechanism configured to (a) determine a first sampling rate of a first digital audio signal having samples, (b) output at least one sample from the first digital audio signal as part of a second digital audio signal, the second digital audio signal having a second sampling rate, the second sample rate being lower than the first sampling rate, (c) increment a first counter for each sample from the first digital audio signal that is output as part of the second digital audio signal, (d) skip at least one sample from the first digital audio signal when the first counter exceeds a first threshold number, (e) repeat (b), (c) and (d) until all samples in the first digital audio signal have been outputted or skipped.

20. The operating system of claim 19, further comprising:

an audio output control mechanism configured to control an audio output device; and an upsampling mechanism configured to (a) determine a third sampling rate of a third digital audio signal having samples, (b) output at least one sample from the third digital audio signal as part of a fourth digital audio signal, the fourth digital audio signal having a fourth sampling rate, the fourth sample rate being higher than the third sampling rate, (c) increment a second counter for each sample from the third digital audio signal that is output as part of the fourth digital audio signal, (d) insert at least one synthetic sample as part of the fourth digital audio signal when the second counter exceeds a second threshold number, (e) repeat (b), (c) and (d) until all samples in the third digital audio signal have been output.

* * * * *